United States Patent [19]

Ho et al.

[11] 4,014,036
[45] Mar. 22, 1977

[54] SINGLE-ELECTRODE CHARGE-COUPLED RANDOM ACCESS MEMORY CELL

[75] Inventors: Irving T. Ho, Poughkeepsie; Hwa N. Yu, Yorktown Heights, both of N.Y.

[73] Assignee: IBM Corporation, Armonk, N.Y.

[22] Filed: Sept. 24, 1973

[21] Appl. No.: 400,481

Related U.S. Application Data

[63] Continuation of Ser. No. 159,860, July 6, 1971, abandoned.

[52] U.S. Cl. .................................. 357/24; 357/23
[51] Int. Cl.² ................................ H01L 29/78
[58] Field of Search ........................ 357/24, 23

[56] References Cited

UNITED STATES PATENTS

| | | | |
|---|---|---|---|
| 3,533,089 | 10/1970 | Wahlstrom | 357/24 |
| 3,651,349 | 3/1972 | Kahng et al. | 357/24 |
| 3,654,499 | 4/1972 | Smith | 357/24 |

*Primary Examiner*—Edward J. Wojciechowicz
*Attorney, Agent, or Firm*—Wolmar J. Stoffel

[57] ABSTRACT

A charge-coupled random access memory cell is formed in a semiconductor body divided into three adjacent regions. The first region has an impurity diffused therein and serves alternately as a source and a drain for charge carriers. The second or gate region has a predetermined threshold voltage and the third or storage region has a lower threshold voltage. A single unitary metal electrode extends in superimposed relation to the second and third regions. Upon the application of potentials to the first region and the electrode, charge carriers may be stored in or removed from the third region so as to write a "1" or a "0" in the cell.

6 Claims, 31 Drawing Figures

INVENTORS
IRVING T. HO
HWA N. YU

BY Martin G. Reiffin

ATTORNEY

SINGLE-ELECTRODE CHARGE-COUPLED RANDOM ACCESS MEMORY CELL

This is a continuation, of application Ser. No. 159,860 filed July 6, 1971, now abandoned.

CROSS-REFERENCE TO RELATED APPLICATION

Application Serial Number 169,961, filed Aug. 9, 1971 by N. G. Anantha and T. L. Chiu and entitled "Charge-Coupled Random Access Memory Cell" discloses a device wherein separate electrodes are provided for the gate and storage regions, respectively.

BACKGROUND OF THE INVENTION

1. Field of the Invention

This invention relates generally to random access memory cells and more particularly to charge-coupled cells wherein the presence or absence of charge carriers indicates respectively a 1 or a 0 stored in the cell. Such cells may be arranged in a matrix of word and bit lines to constitute a random access memory suitable for use in digital computers.

2. Description of the Prior Art

In accordance with the prior art as disclosed in said application Ser. No. 169,961, a charge-coupled memory cell comprises a semiconductor body divided into three adjacent regions. The first region has an impurity diffused therein and serves as a source for charge carriers which may be either holes or electrons. The second region functions as a gate between the first and third regions and has a gate electrode superimposed thereover. The third region acts as a capacitor and serves to store the charge carriers. A storage electrode extends in superimposed relation to the third region.

When it is desired to store a "1" in the cell, suitable potentials are applied to the source region and the two electrodes to cause charge carriers to flow from the source region through the gate region and into the storage region. When it is desired to store a "0" in the cell, the applied potentials are such as to prevent the flow of charge carriers so that the storage region is relatively free of carriers.

SUMMARY OF THE INVENTION

The present invention relates to a charge-coupled random access memory cell which differs from the prior art in that instead of separate gate and storage electrodes, there is provided a single unitary electrode which extends in superimposed relation to both the gate and storage regions. Control of the flow of charge to these regions is achieved by providing the gate region with a predetermined threshold voltage and the storage region with a lower threshold voltage. This difference in threshold voltages provides the required difference in surface potentials in the two regions notwithstanding the application to both regions of the same electrode voltage by the single electrode.

The difference in threshold voltages for the two regions can be obtained in a number of ways. One technique is to provide two different thicknesses for the silicon dioxide insulating layer overlying the respective regions, the layer overlying the gate region being relatively thick as compared with the thinner layer overlying the storage region.

Another technique for providing a difference in threshold voltages is to provide that the insulating layers separating the gate and storage regions from the electrode be formed of different materials having different dielectric constants. For example, silicon dioxide may extend over the gate region and silicon nitride may extend over the storage region.

Still another technique is to provide that the respective insulating layers have different work functions, as obtained, for example, by the use of aluminum over the gate region and doped polycrystalline silicon over the storage region.

Still another technique for achieving the required difference in threshold voltages in the gate and storage regions is to impart an impurity to the gate region. This may be achieved by diffusion or by ion implantation.

There are several important advantages obtained by the use of a single unitary electrode instead of the separate gate and storage electrodes of the prior art. First, it results in a very dense cell; that is, the cell is small and compact. This lowers the cost of production by permitting more circuitry for a given silicon area. The smaller cell size also provides faster operation and shorter switching times.

Another advantage of the single electrode is that it provides a simpler cell structure. This achieves greater economy in production because it results in higher yields.

Still another advantage of the single electrode structure is that it permits the use of a simpler manufacturing process. This also results in higher yields and therefore greater economy in production.

Other advantages of the present invention are either inherent in the structure disclosed or will be apparent to those skilled in the art as the detailed description proceeds.

DESCRIPTION OF THE PREFERRED EMBODIMENTS

Figure 1:
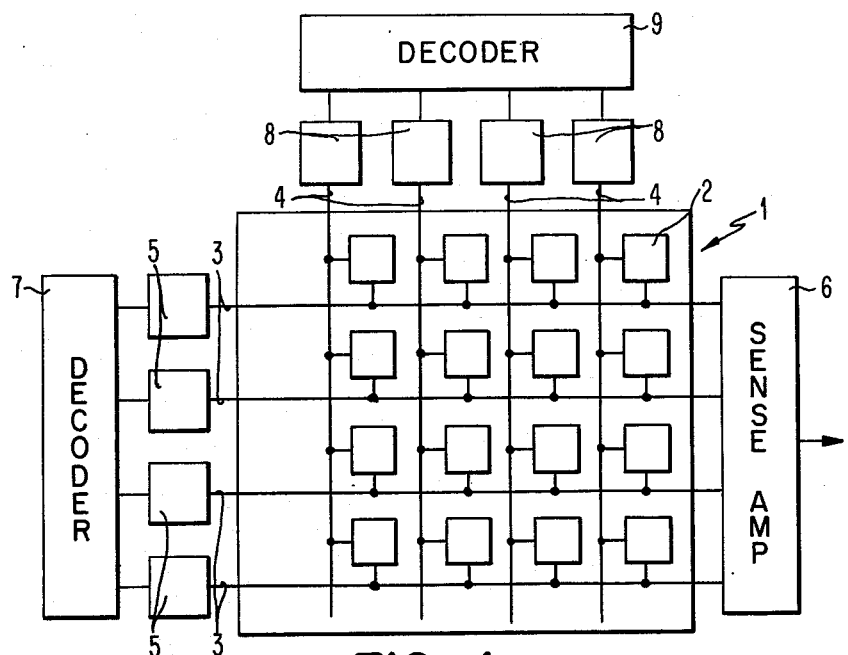
FIG. 1 is a schematic diagram showing the overall memory system embodying memory cells in accordance with the present invention.

Referring first to FIG. 1, there is shown an overall memory system embodying the novel memory cells in accordance with the present invention. The reference numeral 1 indicates generally a monolithic silicon chip in which the memory cells are formed. The cells are designated schematically at 2. Connected to the cells 2 are a series of horizontally extending bit lines 3 and a series of vertically extending word lines 4. A preamplifier 5 is connected to each of the bit lines 3 which are also connected to a set of sense amplifiers 6. A bit decoder 7 is connected to the preamplifiers 5. Each of the word lines 4 is connected to a word driver 8 to which is connected a word decoder 9.

Figure 2:
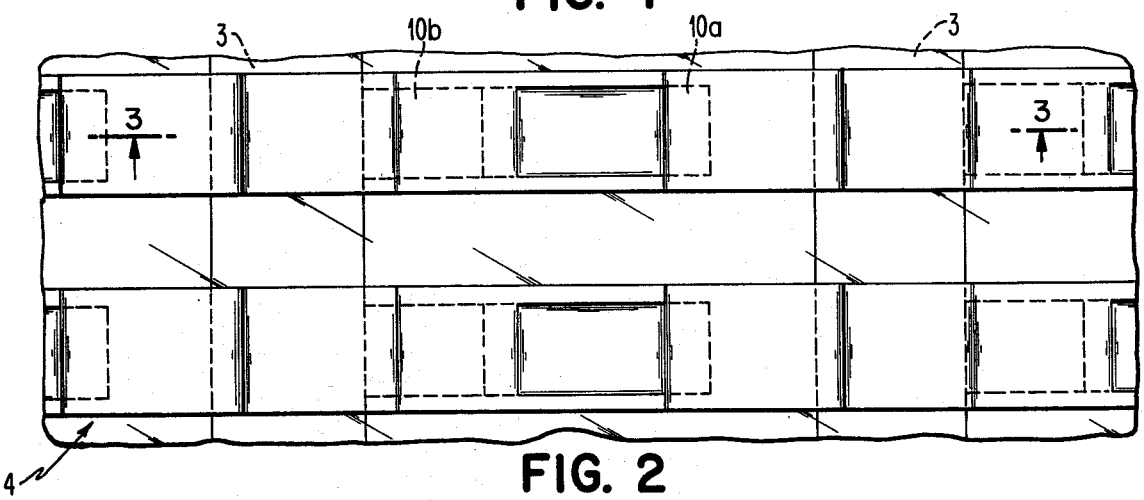
FIG. 2 is a plan view of the monolithic chip showing several of the memory cells in accordance with the preferred embodiment of the invention.
Figure 3:
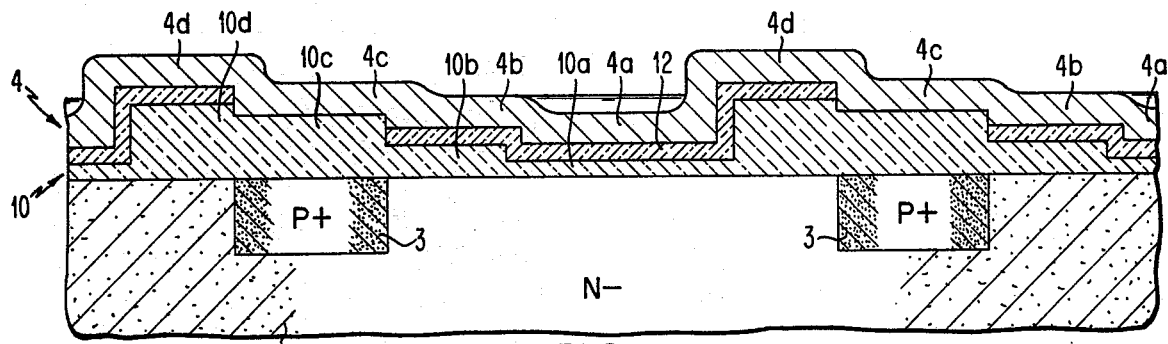
FIG. 3 is a sectional view taken on line 3—3 of FIG. 2.

Referring now to FIGS. 2 and 3, there is disclosed a preferred embodiment of the invention. The silicon chip 1 is formed with an $N^-$ impurity concentration of approximately $5 \times 10^{15}$ atoms per centimeter$^3$. The bit lines 3 are formed by $P^+$ diffusions and have an impurity concentration of approximately $10^{20}$ atoms per centimeter$^3$. Extending over the silicon chip 1 is a layer 10 of silicon dioxide, a layer 12 of silicon nitride, and the word line 4 which is formed of metal such as aluminum. The word line 4 comprises a lowermost portion 4a and stepped portions 4b, 4c, 4d, providing the silicon dioxide layer 10 with four different thicknesses. Underneath the lowermost portion 4a of word line 4, there extends the thin layer 10a of silicon dioxide. This layer 10a is approximately 300A thick. Underneath the word line portion 4b is a medium thick silicon dioxide layer 10b of approximately 1500A thick. Over the $P^+$ bit diffusion line 3, there is grown a silicon dioxide layer 10c of approximately 5000A thick. Underneath the word line portion 4d there is grown the thickest oxide layer 10d of approximately 6000A thick. The silicon nitride extends over silicon dioxide layers 10a, 10b and 10d and is approximately 300A thick. The word line 4 is approximately 1 micron in thickness.

The upper portion of silicon chip 1 directly beneath the word line portion 4a is termed the "storage region" because the holes are stored there. The region between the storage region and the diffused bit line region 3 is termed the "gate region".

Figure 23:
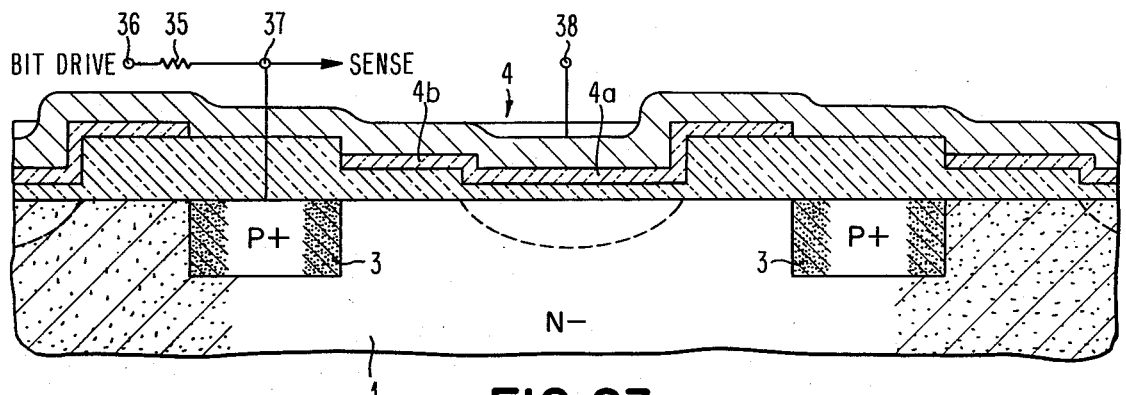
FIG. 23 is a schematic sectional view utilized in the description of the "reach-through" mode of operation.

Referring now to FIGS. 23 to 31 inclusive, there will be described the preferred "reach-through" mode of operation of the embodiment of FIGS. 2 and 3. In FIG. 23 the diffused bit line 3 is shown connected to the sense output terminal 37 which is in turn connected to a resistor 35 in turn connected to the bit drive terminal 36. The word line 4 is shown connected to the word line terminal 38.

Figure 24:
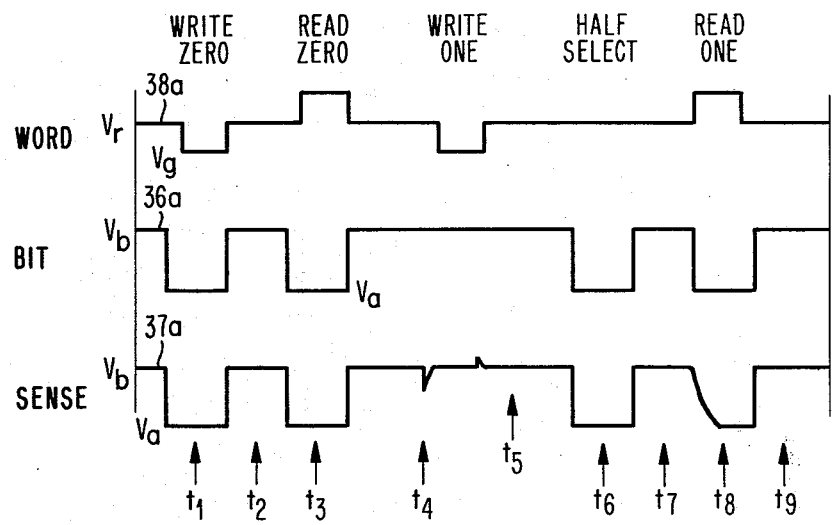
FIG. 24 is a set of waveforms utilized in describing the "reach-through" mode of operation.

In FIG. 24, there are shown the two voltage waveforms which are applied to the word line terminal 38 and the bit drive terminal 36, respectively, and also the voltage waveform which is derived from the sense output terminal 37. The waveform of the voltage applied to the word line terminal 38 is designated 38a; the waveform of the voltage applied to the bit drive terminal 36 is designated 36a; and the waveform of the voltage derived from the sense output terminal 37 is designated 37a.

Figure 25:
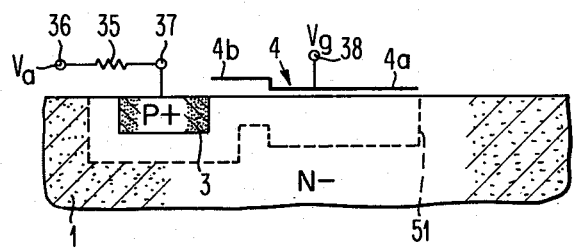
FIGS. 25 to 31 inclusive are schematic diagrams showing the applied voltages, charge carriers and depletion layers during the "reach-through" mode of operation.

Referring to FIG. 25, there are shown the applied voltages and depletion layer boundaries during the "write zero" operation at time $t_1$ shown in FIG. 24. The diffused bit line 3 is at voltage $V_a$ which is preferably about $-10$ volts, and the word line 4 has applied thereto the voltage $V_a$ which is preferably about $-7$ volts. The resulting depletion layer boundary is shown by the dashed lines at 51. Although "reach-through" has occurred in the sense that the depletion layer of the bit line diffusion region 3 has reached the depletion layer formed by the negative voltage on the word line 4, no holes will flow from region 3 into the respective gate storage regions under the word line portions 4a, 4b. This is because the large negative voltage $V_a$ provides an electric field intensity vector extending from right to left as viewed in FIG. 25 so that the holes are retained in the bit line diffusion region 3.

Figure 26:
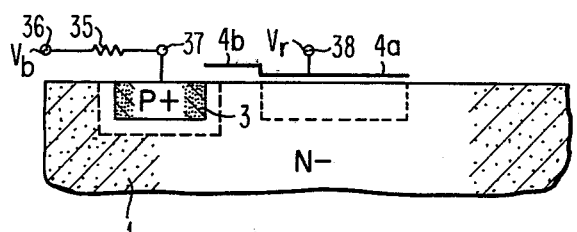

Referring to FIG. 26 there are shown the applied voltages and depletion layer boundaries at time $t_2$ shown in FIG. 24. It will be seen that the depletion layer boundaries do not make contact and that there is no flow of charge carriers during this interval.

Figure 27:
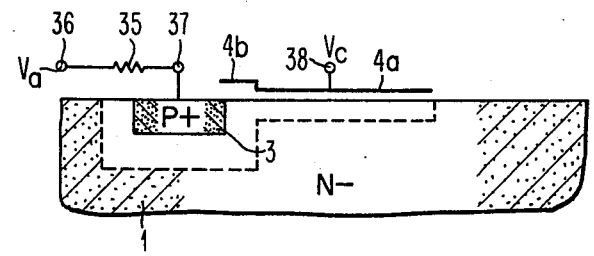

Referring to FIG. 27, there are shown the applied voltages and depletion layer boundaries at time $t_3$ shown in FIG. 24. This is during the "read zero" operation. It will be seen that no holes will flow either from or to the bit line diffusion region 3 and hence no current flows through resistor 35. Therefore the voltage at the sense output terminal 37 will be the same as that applied to the bit drive line 36, thereby indicating that a "zero" has been read.

Figure 28:
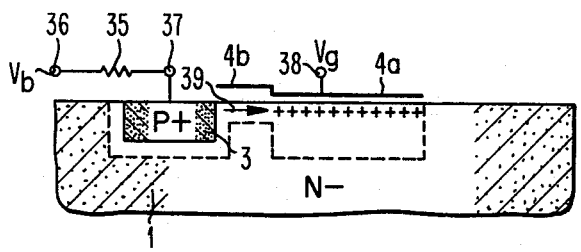

Referring to FIG. 28, there are shown the applied voltages and depletion layer boundaries at time $t_4$ shown in FIG. 24. This is during the "write one" operation. The voltage $V_b$ applied to the bit drive line 36 is about $-3$ volts and the voltage $V_a$ applied to the word line terminal 38 is about $-7$ volts. Since the voltage $V_a$ is more negative than $V_b$, the resulting electric field in the depletion regions may be represented by the electric field intensity vector 39, extending from left to right as viewed in FIG. 28. This causes positive charge carriers or holes to flow from the diffused bit line region 3 through the second or gate region under the bit line portion 4b to the third or storage region under the word line portion 4a. The holes are indicated by the + symbols in FIG. 28.

Figure 29:
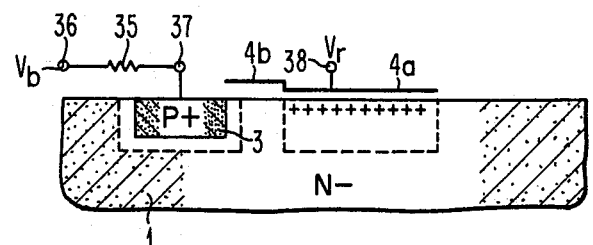

Referring to FIG. 29, there are shown the applied voltages and depletion layer boundaries at time $t_5$ shown in FIG. 24. It will be seen that the depletion layer boundaries do not reach each other and that there is no flow of charge carriers during this interval. The holes which flowed into the storage region under word line portion 4a during time $t_4$ remain stored therein as indicated by the + symbols in FIG. 29.

Figure 30:
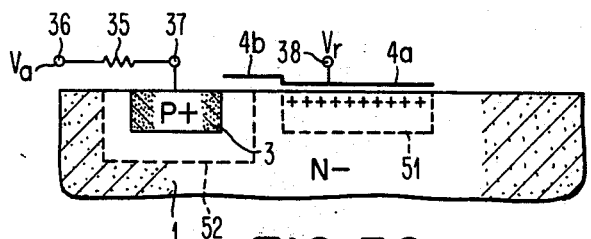

Referring to FIG. 30, there are shown the applied voltages and depletion layer boundaries at time $t_6$ shown in FIG. 24. This is during a so-called "half-select" operation during which the bit drive terminal 36 is pulsed but the word line terminal 38 is not pulsed, as shown in FIG. 24 by the waveforms 36a, 38a. It will be seen that although the depletion layer boundary 52 around the diffused bit line region 3 has expanded outwardly, the depletion layer boundary 51 of the storage region under the word line portion 4a remains in the same position as at time $t_5$ and that the two depletion layer boundaries 51, 52 do not make contact. Therefore, the holes indicated by + symbols in FIG. 30 remain in the storage region and no flow of charge carriers occurs.

Referring to FIG. 24, at time $t_7$ the applied voltages are the same as at $t_5$ and hence the depletion layer boundaries 51, 52 and the holes indicated by the + symbols are the same as shown in FIG. 29 at time $t_5$.

Figure 31:
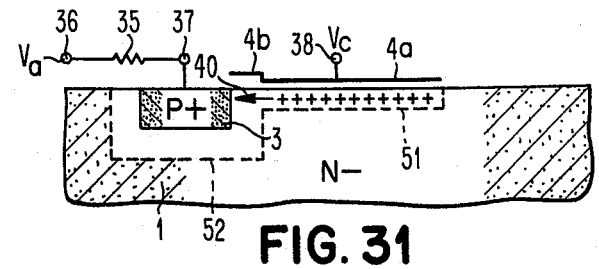

Referring now to FIG. 31, there are shown the applied voltages and depletion layer boundaries at time $t_8$ shown in FIG. 24. It will be seen that the depletion layer boundaries 51, 52 of the storage and diffused regions respectively, are in contact. The voltage $V_a$ a bit drive terminal 36 is about −10 volts and the voltage $V_c$ at word line terminal 38 is −1 volt. This creates a continuous depletion region wherein the electric field is represented by the electric field intensity vector indicated by the arrow at 40 and extending from right to left as viewed in FIG. 31. The holes indicated by the + symbols will therefore flow to the left as viewed in FIG. 31 from the storage region underneath the word line portion 4a to the diffused bit line region 3 and then through the resistor 35. This causes the leading edge of the pulse at $t_8$ in FIG. 24 to assume the approximately exponential curvature shown instead of having a vertical leading edge as indicated for the waveform 36a of the voltage applied to the bit drive terminal 36. This curvature of the leading edge of the pulse at time $t_8$ is then sensed by a differential amplifier (not shown) in the usual manner to designate that a "one" has been read out of the memory for this particular cell.

Referring to FIG. 24, at time $t_9$ the applied voltages, depletion layer boundaries and absence of holes are the same as shown for time $t_2$ in FIG. 26.

It will be seen that the flow of holes between the diffused bit line region and the storage region is controlled by a single electrode by the expedient of providing that the threshold voltage in the gate region be higher than the theshold voltage in the storage region. This difference in threshold voltages is achieved by having a relatively thin oxide layer 10a over the storage region and a somewhat thicker oxide region 10b over the gate region. However, other ways of achieving the difference in threshold voltages may be employed and are illustrated in the other embodiments disclosed in the drawings and described in detail hereinbelow.

Figure 4:
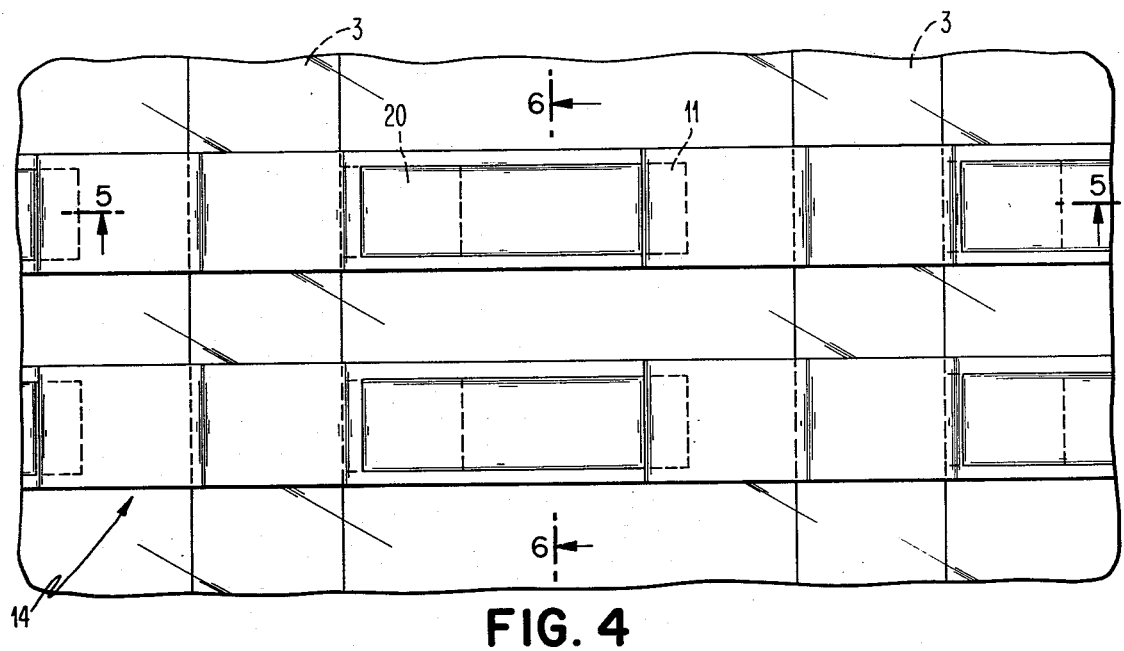
FIG. 4 is a plan view showing another embodiment of the invention.
Figure 5:
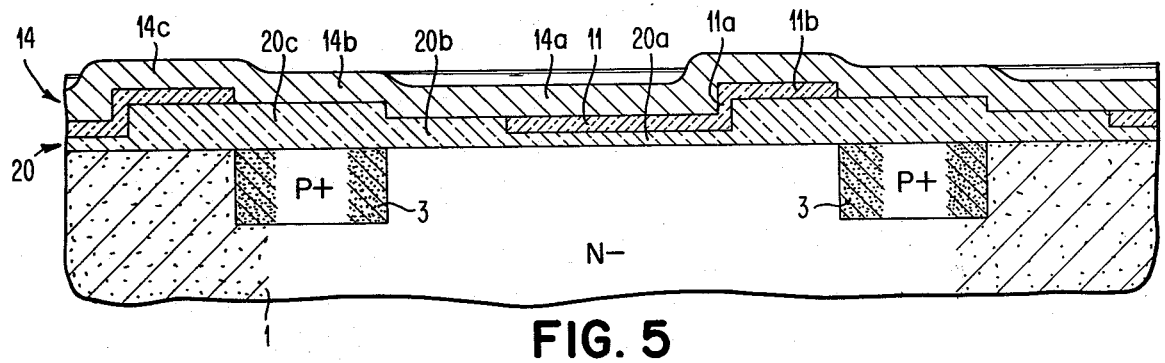
FIG. 5 is a longitudinal sectional view taken on line 5—5 of FIG. 4.
Figure 6:
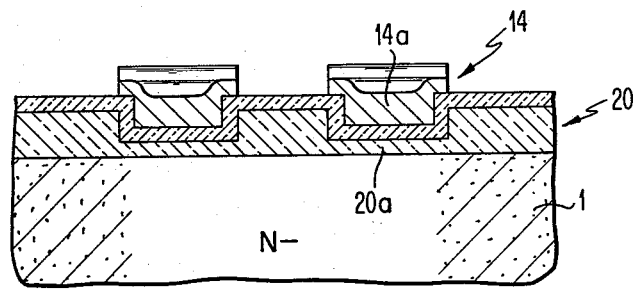
FIG. 6 is a transverse sectional view taken on line 6—6 of FIG. 4.

Referring now to FIGS. 4 to 6 inclusive, there is shown a modified form of the invention wherein the difference in threshold voltages is provided by a difference in dielectric constants of the insulating layers superimposed over the gate and storage regions respectively. More specifically, as shown in FIG. 5 the reference numeral 14 designates generally a metal conductor word line of about one micron in thickness and having a first horizontal portion 14a extending over both the gate and storage regions to be formed in the silicon chip 1. The word line 14 is further provided with a portion 14b stepped upwardly with respect to the portion 14a and overlying the diffused bit line region 3, and a still higher stepped portion 14c.

Extending over the storage region and directly beneath the word line portion 14a is an insulating layer of silicon nitride of a thickness of about 1500A and having at one edge an upstanding portion 11a leading to a higher horizontal portion 11b. Extending between the silicon nitride layer 11 and the upper surface of silicon chip 1 is a relatively thin layer 20a of silicon dioxide about 300A thick. Extending over the gate portion is a silicon dioxide layer 20b of a medium thickness of about 2000A. Extending over the diffused bit line region 3 is a thick silicon dioxide layer 20c about 6000A thick.

The embodiment of FIGS. 4 to 6 inclusive may operate in either the "reach-through" mode described above and shown in FIGS. 23 to 31, or in the "clear" mode shown in FIGS. 15 to 22 and to be described in detail below.

Figure 7:
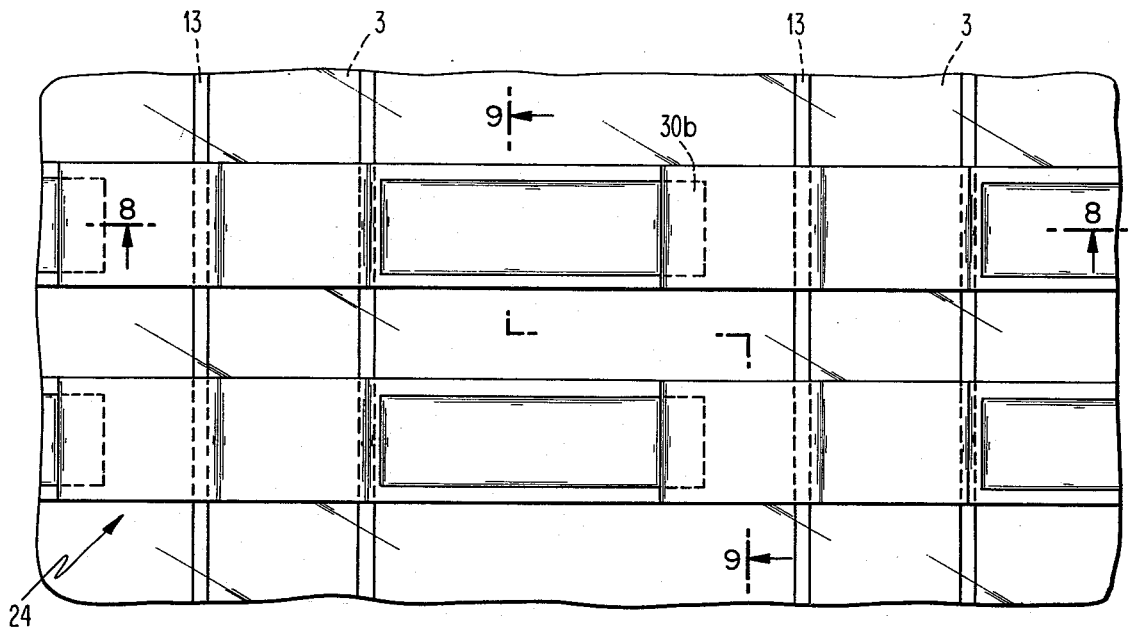
FIG. 7 is a plan view showing still another embodiment of the invention.
Figure 8:
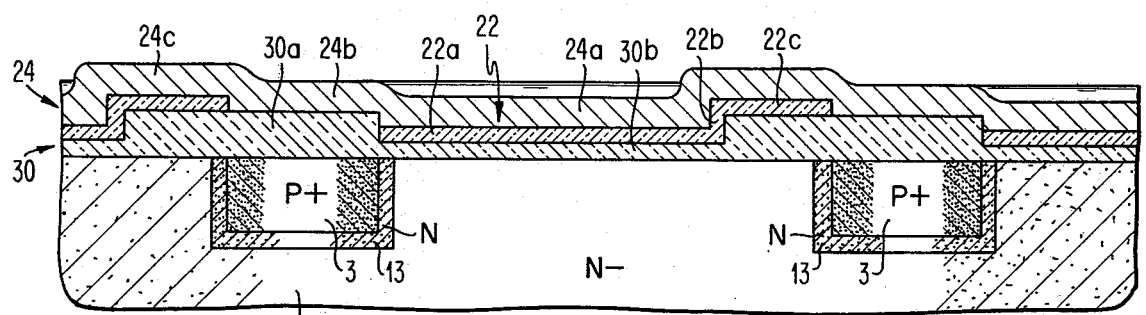
FIG. 8 is a longitudinal sectional view taken on line 8—8 of FIG. 7.
Figure 9:
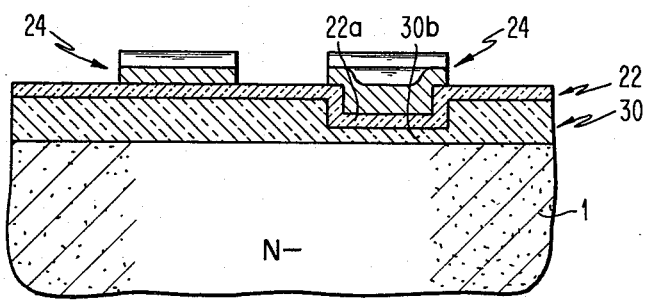
FIG. 9 is a transverse sectional view taken on line 9—9 of FIG. 7.

Referring now to FIGS. 7 to 9 inclusive, there is shown another modified form of the invention wherein the difference is threshold voltages of the gate and storage regions is provided by a second diffusion 13 of N-type material diffused through the same opening as the diffusion which forms the bit line diffusion region 3. More particularly, the reference numeral 24 designates generally a metallic word line 24 of about 10,000A thick and provided with a lowermost horizontal portion 24a, an intermediate portion 24b, and an uppermost portion 24c.

Extending below the word line portion 24a is an insulating layer 22 of silicon nitride having at one edge an upstanding portion 22b leading to an uppermost horizontal portion 22c. The silicon nitride layer is preferably about 500A thick. Extending between the silicon nitride layer 22 and the upper surface of the silicon chip 1 is a relatively thin layer 30b of silicon dioxide of about 500A thick. The silicon dioxide layer extending between the upper surface of the silicon chip 1 and the word line portions 24b, 24c is designated 30a and is about 6000 A thick.

The bit line region 3 is formed by diffusion of a P+ type impurity with an impurity concentration of about $10^{20}$ atoms per centimeter$^3$. The second diffusion 13 is of N type material with an impurity concentration of about $3.0 \times 10^{17}$ atoms per centimeter$^3$. The silicon chip 1 is of N− type material with an impurity concentration of about $5 \times 10^{15}$ atoms per centimeter$^3$. The depth of the P+ diffusion 3 is about 2 microns. The depth of the N diffusion 13 is about ½ micron deeper than that of P+ diffusion 3.

The double-diffusion embodiment of FIGS. 7 to 9 may be operated in the "reach-through" mode shown in FIGS. 23 to 31, but is preferably operated in the "clear" mode shown in FIGS. 15 to 22 and to be described in detail below.

Figure 10:
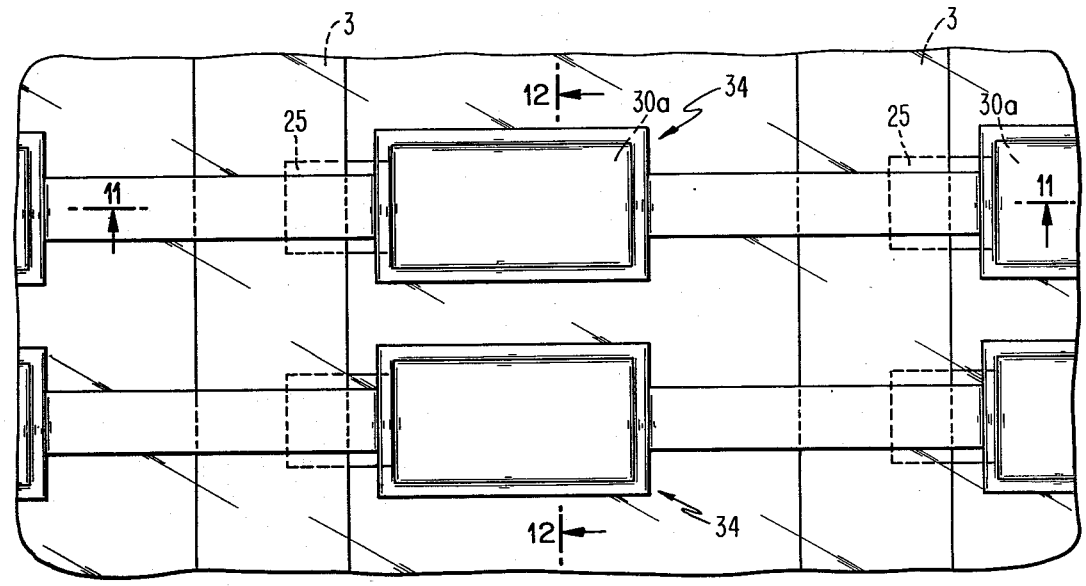
FIG. 10 is a plan view showing still another embodiment of the invention.
Figure 11:
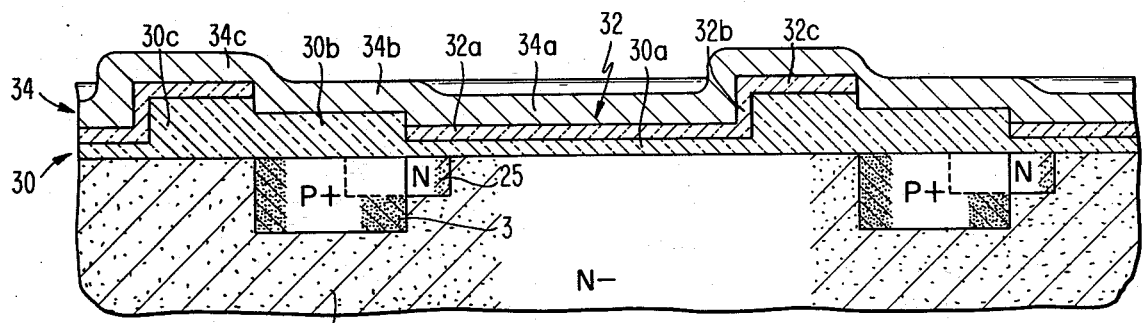
FIG. 11 is a longitudinal sectional view taken on line 11—11 of FIG. 10.
Figure 12:
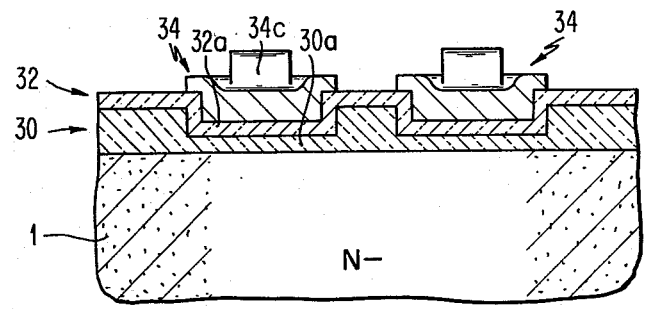
FIG. 12 is a transverse sectional view taken on line 12—12 of FIG. 10.

Referring now to FIGS. 10 to 12 inclusive, there is shown a modified form of the invention wherein the difference in threshold voltages of the gate and storage regions respectively is obtained by providing the gate region with an N type impurity material which may be achieved either by a second diffusion or preferably by ion implantation. This second diffusion or ion implantation region is designated by the reference numeral 25.

More particularly, the reference numeral 34 designates generally a metallic word line about 10,000 A thick and having a lowermost horizontal portion 34a, a stepped intermediate portion 34b, and an uppermost portion 34c. The word line portion 34a extends over the N type region 25 and over the storage region formed in the silicon chip 1. The latter is of N⁻ type material with an impurity concentration of about $5 \times 10^{15}$ atoms per centimeter³. The ion implantation region 25 is formed with an impurity concentration of about $3 \times 10^{17}$ atoms per centimeter³. The impurity concentration of the diffused bit line region 3 is about $10^{20}$ atoms per centimeter³.

Extending beneath the word line portion 34a is an insulating layer 32a of silicon nitride about 500 A thick and having an upstanding portion 32b and an uppermost horizontal portion 32c. Between the silicon nitride layer 32a and the upper surface of the silicon chip 1 extends a relatively thin layer 30a of silicon dioxide about 500 A thick. Between the word line portion 34b and the diffused region 3 there extends a silicon dioxide layer 30b about 6000 A thick. Extending between the silicon nitride portion 32c and the upper surface of silicon chip 1 is a silicon dioxide layer 30c which is slightly thicker than the layer 30b.

The P⁺ bit line diffusion region 3 is formed by diffusion to a depth of slightly less than 2 microns. If ion implantation is used to impart an impurity to the region 25, the depth of this region is between 100 A and 0.5 micron. If diffusion is used to form the region 25, then the depth of the diffusion is approximately 1 micron with an average impurity concentration of $3 \times 10^{17}$ atoms per centimeter³.

Figure 13:
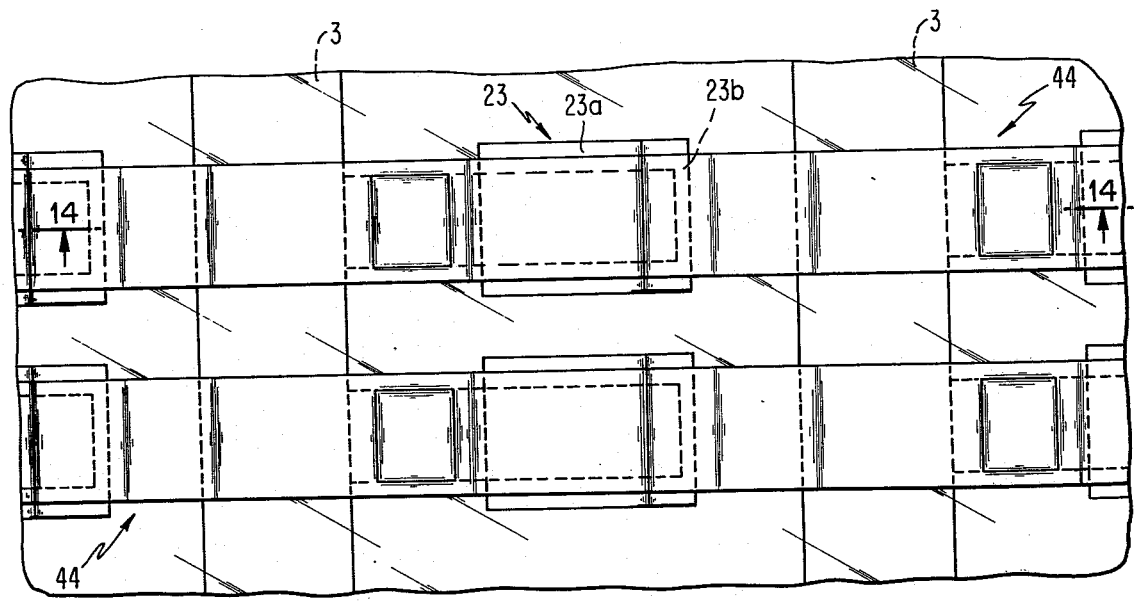
FIG. 13 is a plan view showing still another embodiment of the invention.
Figure 14:
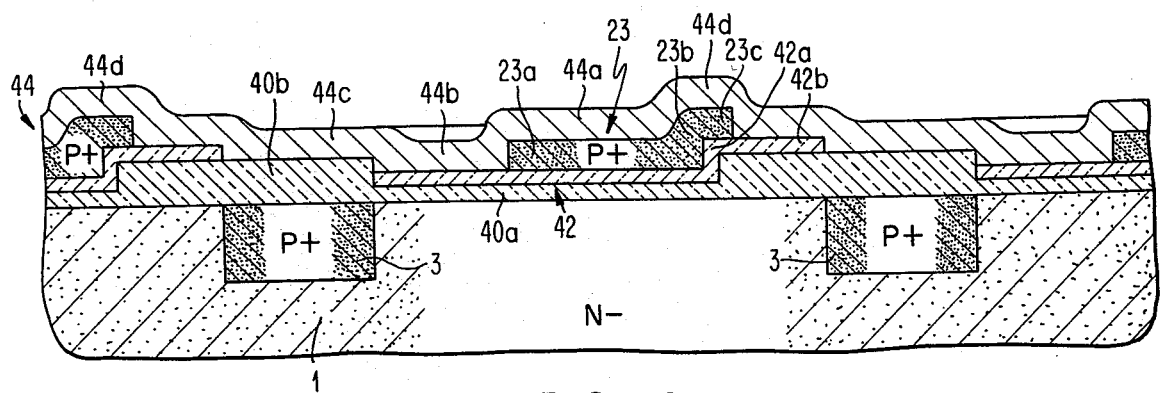
FIG. 14 is a sectional view taken on line 14—14 of FIG. 13.

Referring now to FIGS. 13 and 14, there is shown still another embodiment of the invention wherein the difference in threshold voltages of the gate and storage regions respectively is provided by superimposed insulating layers having different work functions obtained by the inclusion of a layer 23 of polycrystalline silicon. More particularly, the reference numeral 44 designates generally a metallic word line having a horizontal portion 44a, a lowermost portion 44b, an upwardly stepped portion 44c, and an uppermost portion 44d. The various portions on the word line 44 are approximately 1 micron thick.

Extending beneath word line portion 44a is a layer 23 of polycrystalline silicon having a P⁺ impurity and about 6000 A thick. The polycrystalline silicon layer 23 has an upstanding portion 23b and a flange portion 23c underlying word line portion 44d. Extending beneath the word line portion 44b and the polycrystalline layer 23 is a layer 42 of silicon nitride about 500 A thick and having an upstanding portion 42a and an uppermost stepped portion 42b.

Extending between the silicon nitride layer 42 and the upper surface of the silicon chip 1 is a relatively thin layer 40a of silicon dioxide about 500 A thick. Below the word line portion 44c and the silicon nitride layer 42b is a relatively thick layer 40b of silicon dioxide about 6000 A thick. The impurity concentration of the P⁺ bit line diffusion 3 is about $10^{20}$ atoms per centimeter³. The impurity concentration of the N⁻ silicon chip 1 is about $5 \times 10^{15}$ atoms per centimeter³.

Referring now to FIGS. 15 to 22 inclusive, there is shown an alternative mode of operation wherein a "clear" pulse is employed to remove the holes from the storage region.

Figure 15:
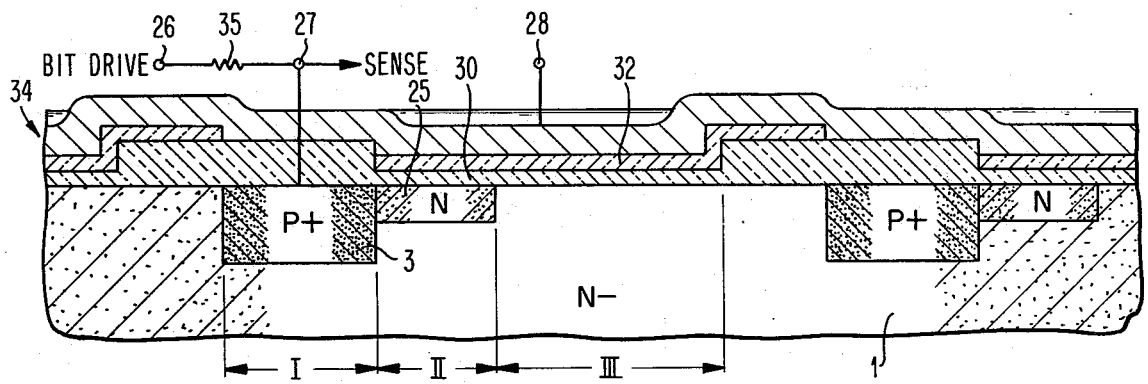
FIG. 15 is a schematic sectional view utilized in the description for describing the "clear" mode of operation of the present invention.

Referring first to FIG. 15, the mode of operation is shown illustrated with reference to the embodiment of FIG. 11 wherein the same reference numerals are applied to corresponding parts. Connected to the word line 34 is a word line terminal 28. Connected to the bit diffusion region 3 is a sense output terminal 27 in series with a resistor 35 and a bit drive terminal 26. The lateral dimensions of the diffusion, gate and storage regions are indicated by the dashed vertical lines and the respective Roman numerals I, II and III.

Figure 16:
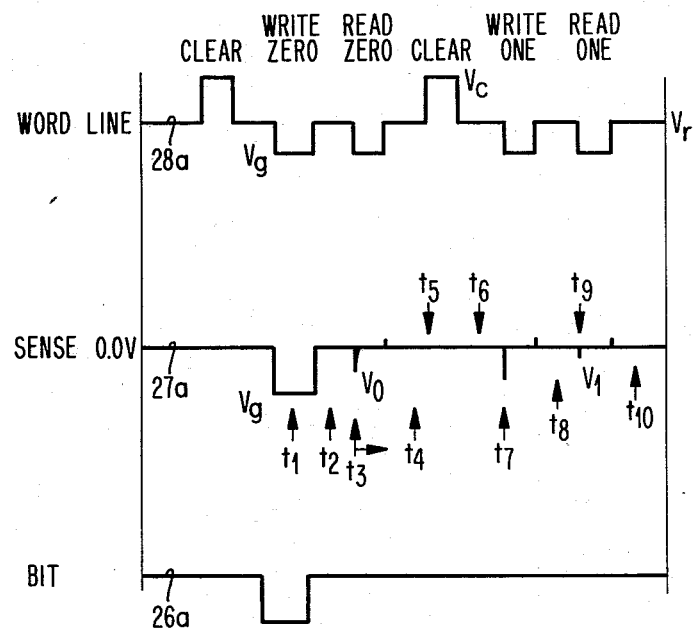
FIG. 16 is a schematic view showing a set of waveforms utilized in describing said mode of operation.

Referring to FIG. 16, there are shown the waveforms 28a, 27a and 26a of the voltages at the word line terminal 28, sense output terminal 27 and bit drive terminal 26, respectively.

Figure 17:
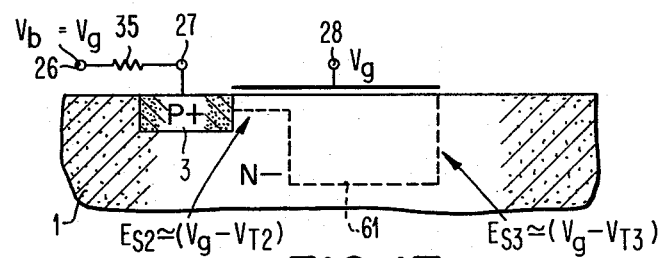
FIG. 17 is a schematic diagram showing the applied voltages and surface potentials during the "write zero" operation.

Referring now to FIG. 17 there are shown the applied voltages and resulting surface potentials at the time $t_1$ during a "write zero" operation. As shown by waveform 28a in FIG. 16, the voltage $V_b$ applied to bit drive terminal 26 is designated $V_g$ and is about −7 volts. The voltage applied to the word line terminal 28 is also $V_g$ at about −7 volts. The magnitude of the resulting potential at the surface of silicon chip 1 is indicated by the dashed line at 61. It will be seen that the surface potential $E_{S2}$ in the second or gate region is equal to $V_g - v_{T2}$ where $V_{T2}$ is the threshold voltage of the second or gate region. The surface potential $E_{S2}$ in the gate region is therefore about −1 volt. $E_{S3}$ is the surface potential in the third or storage region and is equal to about Vg V $v_{T3}$. This is about −6 volts. These applied voltages and resulting surface potentials result in an electric field represented by an electric field intensity vector extending from right to left as viewed in FIG. 17. As a result, no holes flow from the diffused region 3 into the gate or storage region, and there results the "write zero" operation.

Figure 18:
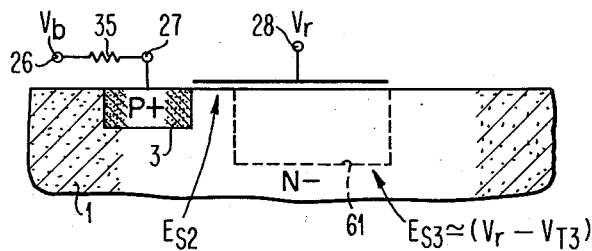
FIG. 18 is a schematic diagram showing the applied voltages and surface potentials during the "store zero" operation.

Referring now to FIG. 18, there are shown the applied voltages and resulting surface potentials at time $t_2$ during the operation of storing a "zero." The bit drive voltage $V_b$ applied to the bit drive terminal 26 is zero volts. The voltage applied to the word line terminal 28 is $V_r$ at about −5 volts. The resulting surface potential $E_{S2}$ in the second or gate region is zero volts, and the resulting surface potential $E_{S3}$ is indicated by the dashed lines at 61 and is −4 volts. It will be seen that as a result of these voltages and potentials, no holes flow and the storage region is maintained free of holes so as to store a "zero."

Figure 19:
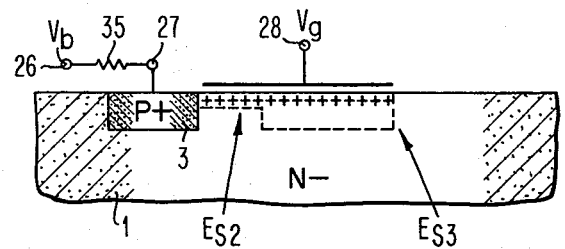
FIG. 19 is a schematic diagram showing the applied voltages and surface potentials during the "read zero" operation.

Referring to FIG. 19, there are shown the applied voltages and resulting surface potentials at time $t_3$ during the operation of reading a "zero." The bit drive voltage $V_b$ applied to the terminal 26 is zero volts and the voltage applied to the word line terminal 28 is $V_g$ at about −7 volts. The surface potentials $E_{S2}$ and $E_{S3}$ in the gate and storage regions respectively is about −1 volt due to the flow of holes into the gate and storage regions as shown by the + symbols. This flow of holes results in a current through resistor 35 so as to result in a sharp negative pulse at the sense output terminal 27 as shown at $V_0$ in waveform 27a of FIG. 16. This negative pulse $V_0$ indicates the reading of a "zero."

Figure 20:
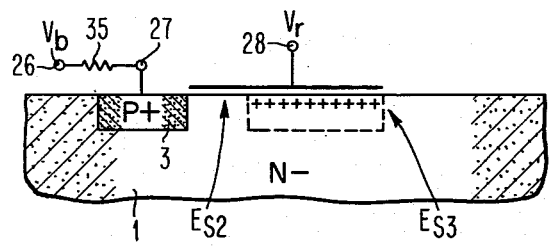
FIG. 20 is a schematic diagram showing the applied voltages and surface potentials before the "clear" operation.

Referring to FIG. 20, there are shown the applied voltages and resulting surface potentials at time $t_4$ before the "clear" operation. The voltage $V_b$ applied to the bit drive terminal 26 is zero volts and the voltage $V_r$ applied to the word line terminal 28 is −4 volts. The resulting surface potential $E_{S2}$ in the gate region is equal to zero and the resulting surface potential $E_{S3}$ in the storage region is equal to −1 volt. It will be seen that the holes indicated by the + symbols remain stored in the storage region until they are removed by the "clear" operation.

Figure 21:
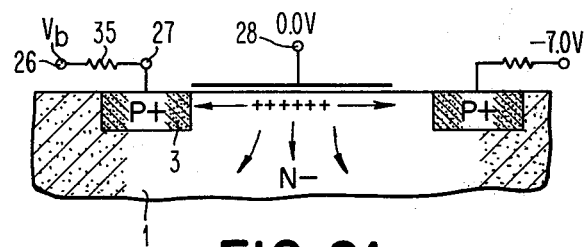
FIG. 21 is a schematic diagram showing the applied voltages and flow of charge carriers during the "clear" operation.

Referring to FIG. 21, there are shown the applied voltages and resulting surface potentials at time $t_5$ during the "clear" operation. The voltage $V_b$ applied to the bit drive line 26 is −7 volts and the voltage applied to the word line terminal 28 is zero volts. The hole diffuse outwardly from the storage region in the directions indicated by the arrows in FIG. 21.

Figure 22:
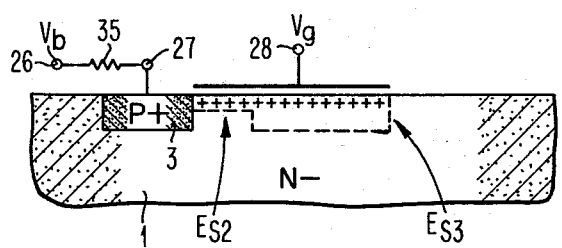
FIG. 22 is a schematic diagram showing the applied voltages and surface potentials during the "read one" operation.

Referring to FIG. 22, there are shown the applied voltages and resulting surface potentials at time $t_9$ during the "read one" operation. The voltage $V_b$ applied to the bit drive line 26 is zero volts and the voltage $V_g$ applied to the word line terminal 28 is −7 volts. The surface potential $E_{S2}$ in the gate region is about −1 volt and the surface potential $E_{S3}$ in the storage region is also about −1 volt. It will be seen that the holes indicated by the + symbols remain stored in the gate and storage regions so that no substantial current flows through the resistor 35. There appears on the bit sense line 27 only a slight voltage pulse $V_1$ due to capacitance effects. The absence of a large pulse, such as at $V_0$ during the "read zero" operation, designates the reading of a "one".

At time $t_6$ after the "clear" operation, the applied voltages and surface potentials are the same as at time $t_2$ as shown in FIG. 18. At time $t_7$ during the "write one" operation the applied voltages and resulting surface potentials are the same as at time $t_3$ as shown in FIG. 19. At time $t_8$ during the operation of storing at a "one", the applied voltages and resulting surface potentials are the same as at time $t_4$ as shown in FIG. 20. At time $t_{10}$ before the "clear" operation, the applied voltages and resulting surface potentials are the same as at time $t_4$ as shown in FIG. 20.

It is to be understood that the various embodiments disclosed herein are merely illustrative of several of the many forms which the invention may take in practice without departing from the scope of the invention as delineated in the appended claims, and that numerous modifications thereof will readily occur to those skilled in the art. The claims are to be construed as broadly as permitted by the prior art.

We claim:

1. A charge coupled random access memory array comprising:
   a semiconductor body having therein an impurity of a first conductivity type,
   a plurality of charge couple memory cells arranged in columns and rows on said body,
   bit lines extending in the column direction, each bit line in operative relation to a column of said cells,
   word lines extending in the row direction, each word line in operative relation to a row of said cells,
   each of said cells comprised of a first region in said semiconductor body having embodied therein an impurity of a second opposite conductivity type, said first region of said cell in operative electrical connection with one of said bit lines,
   a second region in said body in adjacent lateral relationship to said first region in the row direction,
   a third region in said body in adjacent lateral relationship to said second region, and spaced from said first region by said second region, said third region spaced from the first region of the adjacent memory cell,
   a surface layer of dielectric material overlying at least said second region and said third region,
   means associated with said dielectric layer providing said second region with a first predetermined threshold voltage, and said third region with a second threshold voltage less in absolute magnitude than said first predetermined threshold voltage,
   a single conductive electrode on said surface layer of dielectric material and extending over said second and third regions in superimposed relation and in operative electrical connection with one of said word lines,
   said single electrode having a first portion over said second region of said body, and a second portion over said third region of said body,
   a means of applying at least two voltage levels to said conductive electrode to control the storage of charges in, and flow of charges to, said third region, the first of said voltage levels applied to said conductive electrode is of an absolute magnitude less than said first predetermined threshold voltage of said second region, but equal to or greater than said second threshold voltage of said third region, thereby inverting only said third region for charge storage capability,
   the second of said voltage levels of an absolute magnitude equal to or greater than said first predetermined threshold voltage of said second region thereby inverting both of said second and third regions for charge flow capability.

2. A charge-coupled random access memory array as recited in claim 1 and comprising
   means for sensing the charge stored in said third region.

3. A charge-coupled random access memory array as recited in claim 1 and comprising
   an insulating layer extending between said electrode and said semiconductor body,
   said insulating layer having a predetermined thickness between said electrode and said second region,
   said insulating layer having between said electrode and said third region a thickness less than said predetermined thickness.

4. A charge-coupled random access memory array as recited in claim 3 wherein
   said insulating layer comprises silicon dioxide.

5. A charge-coupled random access memory array as recited in claim 4 and comprising:
   means for sensing the charge stored in said third region.

6. A charge coupled random access memory array as recited in claim 1 comprising
   a preamplifier and a sense amplifier connected to each of said bit lines,
   a decoder connected to said preamplifiers,
   a word driver connected to each of said word lines, and
   a decoder connected to said word drivers.

* * * * *